(12) United States Patent
Baensch et al.

(10) Patent No.: US 11,534,827 B2
(45) Date of Patent: Dec. 27, 2022

(54) ROLL STAND

(71) Applicant: SMS group GmbH, Düsseldorf (DE)

(72) Inventors: Michael Baensch, Viersen (DE); Verena Thome, Willich (DE)

(73) Assignee: SMS group GmbH, Düsseldorf (DE)

( * ) Notice: Subject to any disclaimer, the term of this patent is extended or adjusted under 35 U.S.C. 154(b) by 0 days.

(21) Appl. No.: 16/764,175

(22) PCT Filed: Nov. 15, 2018

(86) PCT No.: PCT/EP2018/081447
§ 371 (c)(1),
(2) Date: May 14, 2020

(87) PCT Pub. No.: WO2019/101628
PCT Pub. Date: May 31, 2019

(65) Prior Publication Data
US 2020/0384540 A1 Dec. 10, 2020

(30) Foreign Application Priority Data

Nov. 27, 2017 (DE) .................... 10 2017 221 126.1

(51) Int. Cl.
*B22F 5/00* (2006.01)
*G06F 30/23* (2020.01)
*B21B 21/00* (2006.01)
*B22F 10/20* (2021.01)
*B33Y 80/00* (2015.01)

(52) U.S. Cl.
CPC .............. *B22F 5/008* (2013.01); *B21B 21/00* (2013.01); *B22F 10/20* (2021.01); *G06F 30/23* (2020.01); *B33Y 80/00* (2014.12)

(58) Field of Classification Search
CPC .......... B22F 5/008; B22F 10/20; G06F 30/23; B21B 21/00; B21B 13/00; B33Y 80/00; B33Y 10/00; Y02P 10/25
USPC ......................................... 72/237
See application file for complete search history.

(56) References Cited

U.S. PATENT DOCUMENTS

| 3,308,643 A | 3/1967 | Heinz et al. |
| 6,199,610 B1 * | 3/2001 | Yanagawa ........... B60C 11/1618 |
| | | 152/209.5 |
| 2014/0190232 A1 * | 7/2014 | Frauenhuber ....... B21B 15/0085 |
| | | 72/203 |

(Continued)

FOREIGN PATENT DOCUMENTS

| DE | 1287541 B | 1/1969 |
| DE | 102014210201 A1 | 12/2015 |

(Continued)

OTHER PUBLICATIONS

International Search Report with English translation and Written Opinion with Machine translation dated Jan. 25, 2019 in corresponding International Application No. PCT/EP2018/081447; 25 pages.

(Continued)

*Primary Examiner* — Yi-Kai Wang
(74) *Attorney, Agent, or Firm* — Maier & Maier, PLLC

(57) ABSTRACT

A roll stand, wherein at least two rolls for forming a workpiece are accommodated in the stand, and wherein a rolling force acting during the forming is supported by the roll stand, wherein the roll stand is produced by means of additive manufacturing.

7 Claims, 3 Drawing Sheets

(56) References Cited

U.S. PATENT DOCUMENTS

2015/0294034 A1* 10/2015 Liao .................. G06F 30/23
                                                    703/1
2018/0080958 A1*  3/2018 Marchese ............ G01R 15/242
2018/0104863 A1*  4/2018 Cottrell .................. B29C 33/04
2019/0084020 A1*  3/2019 Froböse ................ B21B 31/028

FOREIGN PATENT DOCUMENTS

| EP | 1240955 A1 | 9/2002 |
| EP | 2957365 A1 | 12/2015 |
| EP | 3305494 A1 | 4/2018 |
| WO | 2004/018132 A1 | 3/2004 |
| WO | 2016/190076 A1 | 12/2016 |
| WO | 2017/040403 A1 | 3/2017 |

OTHER PUBLICATIONS

International Written Opinion under Rule 66 dated Oct. 7, 2019 in corresponding International Application No. PCT/EP2018/081447; 16 pages; Machine translation attached.

International Preliminary Report on Patentability dated Feb. 11, 2020 in corresponding International Application No. PCT/EP2018/081447; 16 pages; Machine translation attached.

* cited by examiner

ROLL STAND

FIELD

The disclosure relates to a roll stand and a method for improving an existing rolling mill.

BACKGROUND

DE-OS-1 287 541 describes a roll stand for a multiple cold Pilger rolling mill. A rolling mill is constructed from two roll stands or stand sides, which are connected to one another by means of installed spacer bolts. In such a cold Pilger rolling mill, the roll stand is not arranged to be stationary, but rather is alternately moved by means of a drive.

It is the object of the invention to specify a roll stand which has a low weight at given rolling forces.

SUMMARY

This object is achieved according to the invention for a roll stand mentioned at the outset. A particularly high degree of freedom in the shaping is achieved by the production of the roll stand by means of additive manufacturing, so that the quantity of material required for the roll stand can be reduced.

Additive manufacturing is understood in the present case to mean that a shape and/or design definition provided as a data set is successively built up by adding ultrasmall quantities of material according to the principle of "3D printing".

A roll in the meaning of the present invention is understood in particular as a unit accommodated rotatably in the roll stand, which moreover comprises a tool surface for executing the rolling procedure. In an advantageous construction, such a roll can be formed from a roll shaft and a roll body attached thereon as a tool. The roll body can preferably be formed as a replaceable component. The connection to the roll shaft can particularly preferably be produced by shrinking the roll body onto the roll shaft.

In a first embodiment of the invention, it is provided that the additive manufacturing takes place indirectly, wherein the roll stand is at least partially, preferably completely, formed as a cast part and a casting mold of the roll stand is directly produced by additive manufacturing. By way of this procedure, conventional, well-controllable casting methods for achieving a high material strength can be combined with expanded flexibility of the shaping. Preferred casting materials are steel or cast iron. Cast iron is particularly preferably used in the present case.

In a further embodiment of the invention, it is provided that the roll stand is at least partially, preferably completely, formed directly by additive manufacturing. This permits a maximum level of flexibility of the shaping, wherein a corresponding compatibility with the additive method has to exist with respect to the utilized material.

It is possible in particular to combine the above-explained methods, i.e., direct and indirect additive manufacturing, on the same roll stand.

Depending on the requirements, parts of the roll stand which are less critical with respect to strength and/or weight, can consist of conventional components, in particular standard semi-finished products such as plates.

In general, the invention advantageously relates to roll stands made of an iron-based material having a total mass of greater than 0.5 tons.

It is generally advantageously provided that the roll stand is formed to be a unit drivably movable in the course of a rolling procedure. In this case, it can particularly preferably be a cold Pilger roll stand.

In such movable roll stands, the achievable speed of the rolling procedure is predominantly dependent on the mass and strength of the roll stand, so that an optimized roll stand according to the invention permits an increase of the throughput. In particular, it is possible by way of the optimization according to the invention of cold Pilger roll stands to achieve an increase of the stroke rates during cold Pilger rolling of greater than 10%, in particular greater than 15%, wherein the mass of the roll stand at given rolling forces is reduced by more than 10% in relation to conventional roll stands.

In one preferred refinement, it is provided in this case that at least one crank pin for moving the roll stand is accommodated on the roll stand, wherein the crank pin is particularly preferably not formed by means of additive manufacturing. This permits a particularly resilient design of the crank pin or also the design as a replaceable wearing part. In an alternative embodiment, the crank pin can also be formed by means of additive manufacturing, however.

In one generally advantageous embodiment, it is provided that the roll stand comprises two stand sides, wherein the rolls extend between the stand sides and are mounted in the stand sides. In this case, the stand sides are particularly preferably integrally connected to one another by transverse struts made of uniform material, wherein the transverse struts are produced jointly with the stand side by means of additive manufacturing. This permits a particularly high level of rigidity of the roll stand at low weight.

It is generally preferably provided that a shape of the roll stand is optimized with regard to mass and/or strength by means of a computer optimization using the finite element method. This permits an ideal combination with the advantages of additive manufacturing.

The object of the invention is moreover achieved by a method for improving an existing roll stand, comprising the following steps:

a. recording framework parameters of an existing roll stand;
b. designing a roll stand optimized with respect to at least one property, preferably mass and/or strength, while maintaining the framework parameters recorded in step a.;
c. manufacturing a new roll stand by means of additive manufacturing, preferably as claimed in any one of the preceding claims,
d. replacing the existing roll stand with the new roll stand.

In this manner, an existing cold Pilger rolling mill can be increased in its performance. The new roll stand can be lighter and/or stronger than the existing roll stand due to corresponding optimization, so that after replacement of the roll stands, for example, a higher stroke rate can be used. This permits the improvement of the productivity of existing mills at relatively low costs.

BRIEF DESCRIPTION OF THE DRAWINGS

A preferred exemplary embodiment of the invention will be described hereafter and explained in greater detail on the basis of the appended drawings.

DETAILED DESCRIPTION

Figure 1:
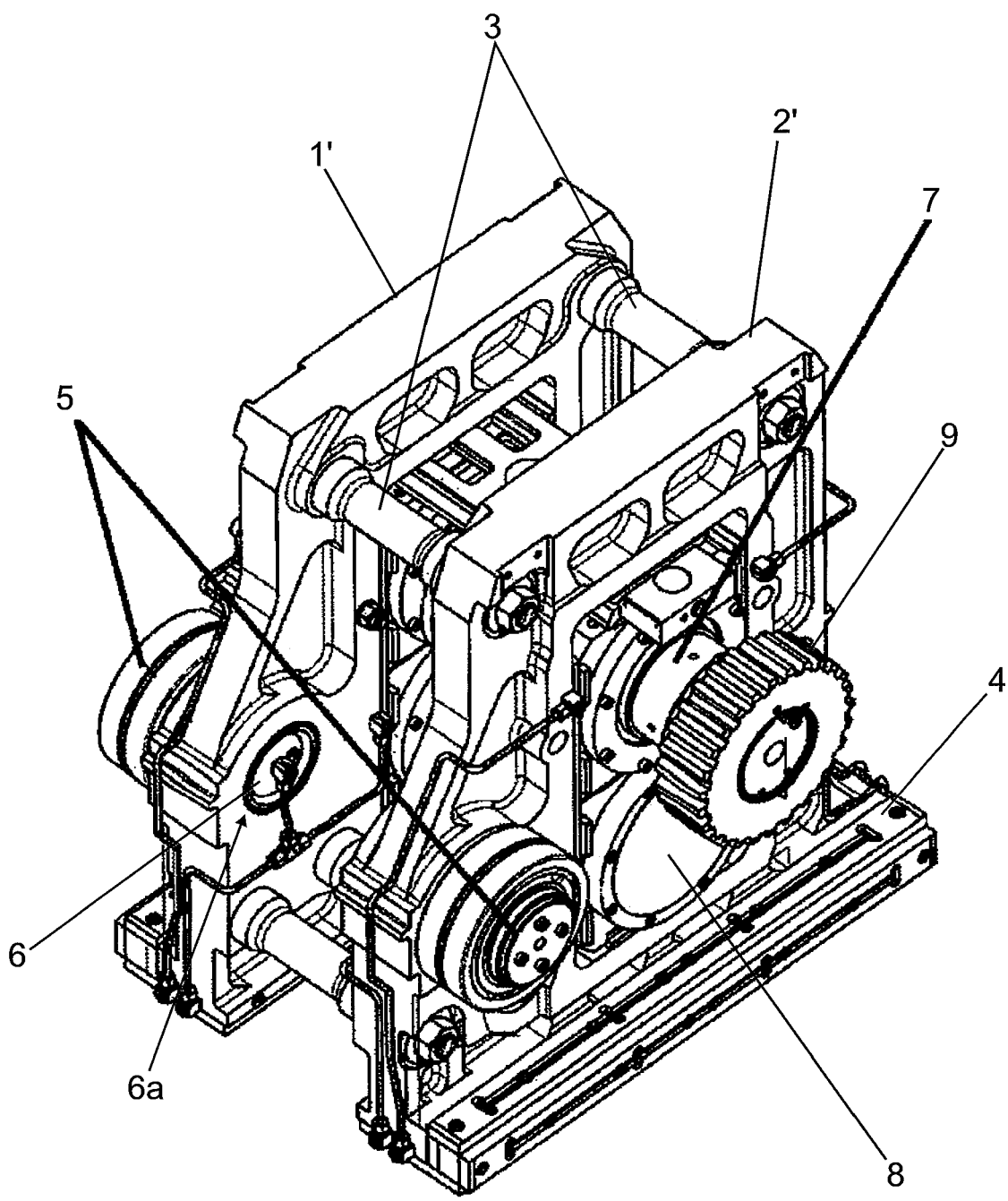
FIG. 1 shows a three-dimensional view of a cold Pilger roll stand having installed rolls according to the prior art.
Figure 2:
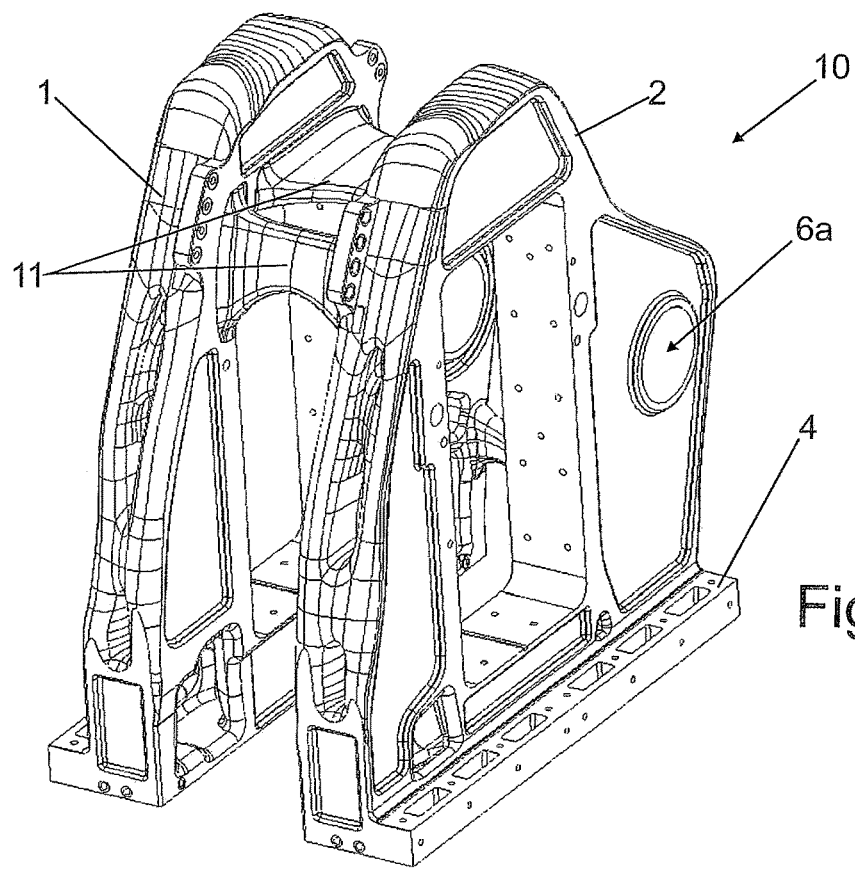
FIG. 2 shows a three-dimensional view of a cold Pilger roll stand according to the invention, which can replace the roll stand from FIG. 1.
Figure 3:
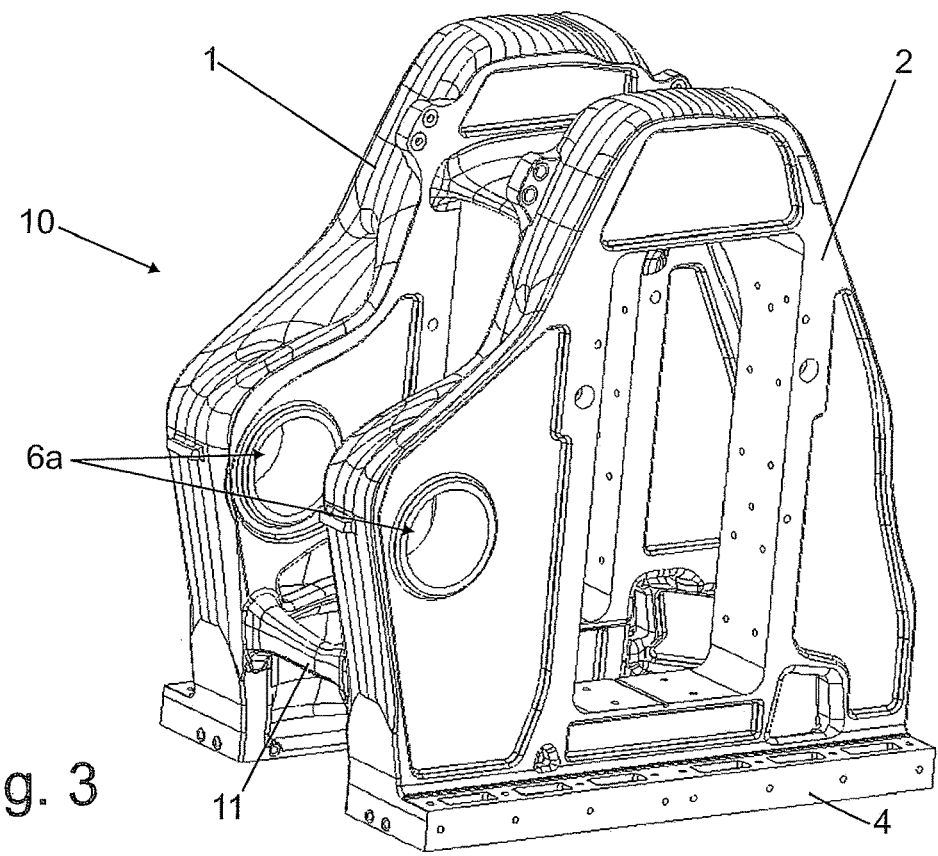
FIG. 3 shows a further three-dimensional view of the roll stand from FIG. 2.
Figure 4:
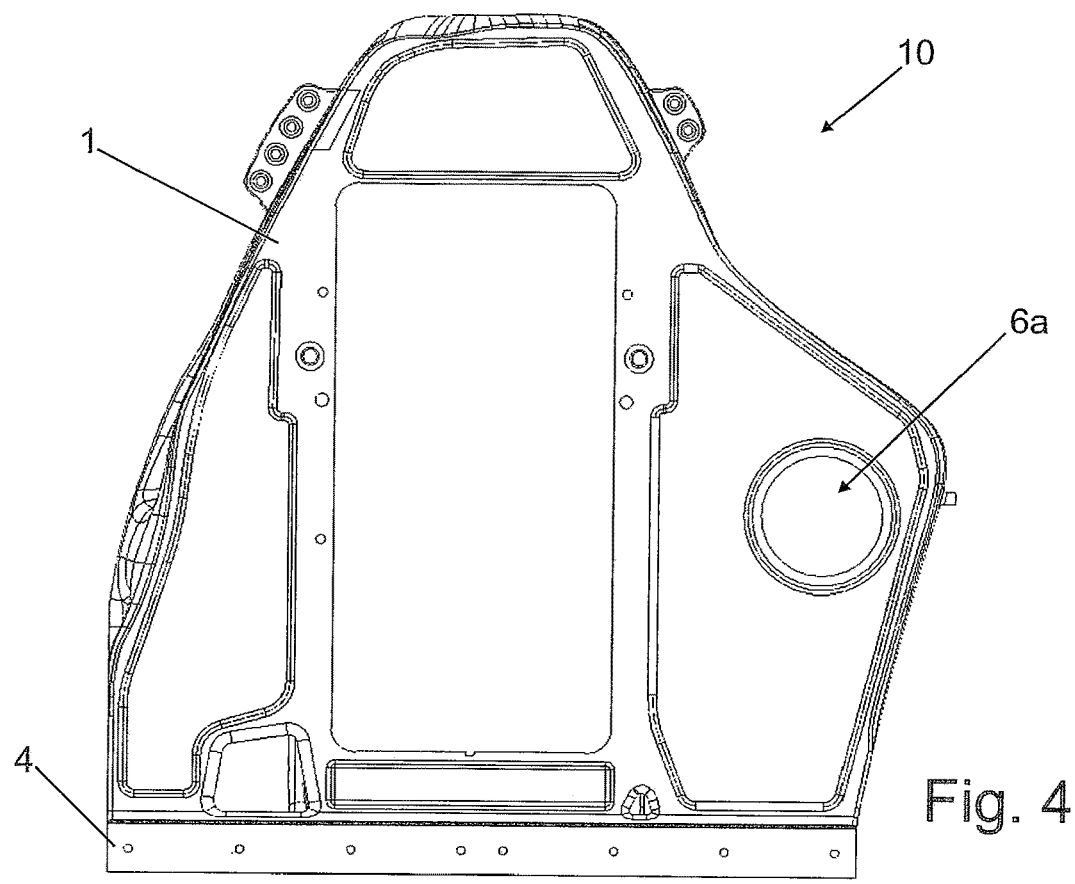
FIG. 4 shows a view from the side of the roll stand from FIG. 2.
Figure 5:
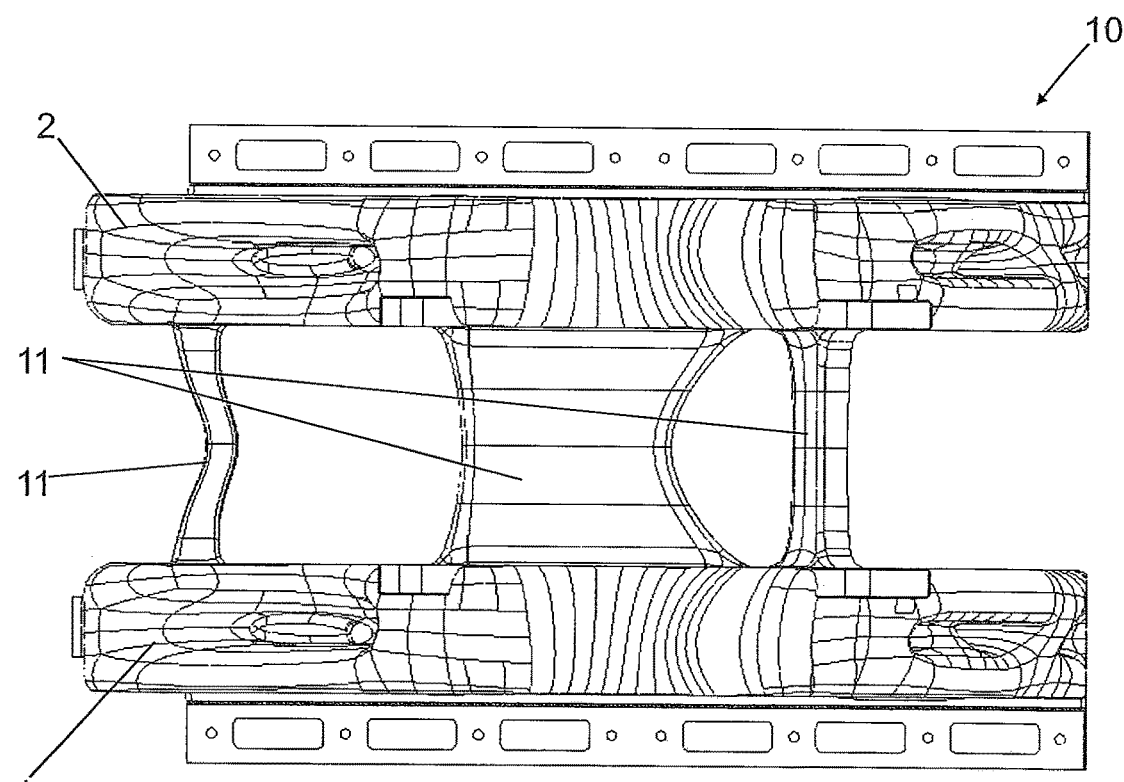
FIG. 5 shows a further three-dimensional view of the roll stand from FIG. 2.

The previously known roll stand shown in FIG. 1 of a cold Pilger rolling device comprises two stand sides 1', 2', which are assembled by a number of separate connecting bolts 3 to form a stand. The roll stand is drivably movable as a whole, wherein retaining elements for the movable mounting on a stationary rail system (not shown) are provided in a lower region. Connecting rods of a drive unit (not shown) engage on bearings 5 to drive the roll stand. The bearings 5 are accommodated on crank pins 6, which are in turn fixed in receptacles 6a in the stand sides 1', 2'. The roll stand is alternately moved translationally at a defined stroke frequency by the connecting rods.

At least two rolls 7, 8 are accommodated or mounted in the stand sides 1', 2'. A rotation of the two rolls 7, 8 is coupled via gear wheels 9 and stationary toothed racks (not shown) to the translational movement of the roll stand.

A tubular workpiece (not shown) runs between the rolls 7, 8 and over a mandrel (not shown). Forming according to the cold Pilger rolling method is performed in a known manner by the alternating movement of the roll stand in conjunction with a corresponding guide of the workpiece. In this case, the rolling force occurring between the rolls 7, 8 is supported by the roll stand 1', 2', 3.

In the present example, the previously known roll stand 1', 2', 3 (without rolls and further fittings) has a mass of approximately 890 kg. The alternating movement takes place at a maximum stroke frequency of 200 strokes per minute.

FIG. 2 to FIG. 5 show a roll stand 10 according to the invention made of cast iron. The shape of this roll stand 10 was optimized on a computer with aid of the finite element method to minimize the mass of the stand at given strength.

Known framework data for the dimensions and minimum strengths of the previously known roll stand 1', 2', 3 were the starting point for the optimization. The shape of the stand was then optimized by means of the finite element method. One criterion in the optimization was that the stand is supposed to be castable in principle, nearly complete design freedom prevailed in the production of the casting mode with respect to undercuts, etc.

As a specification, the achievable stroke frequency was increased to 250 strokes per minute. This required a reinforced design, in particular of the regions around the crank pins 6. The production of the computed stand according to FIG. 2 through FIG. 5 was then performed via indirect additive manufacturing. In this case, the casting mold was produced by a facility for 3D printing by additive manufacturing. The roll stand 10 was then cast by means of this additively manufactured casting mold. In the present case, cast iron was used as the casting material.

The roll stand 10 manufactured in this manner had a mass of approximately 800 kg and increased strength in spite of the stroke frequency, which was increased to 250 strokes per minute.

According to a method according to the invention for improving existing rolling mills, the existing stand 1, 2, 3 shown in FIG. 1 of an existing rolling mill in operation was replaced by the new stand 10. Because of the reduced stand mass, this generally permitted an increase of the stroke frequency of the rolling mill, without the drive device having to experience significant modifications.

The crank pins 6 are also provided in the additively manufactured roll stand 10 as separate components which are fixed in receptacles 6a. These crank pins and the receptacles 6a thereof are among the most strongly mechanically strained points of the roll stand. The shaping ascertained by the finite element method resulted in a bionic shaping of the roll stand 10 having many rounded regions. In particular critical points such as the region around the receptacles 6a of the crank pins 6 are relatively reinforced in this case. In less critical regions, it was possible to thin out and save the stand material.

In contrast to the conventional roll stand 1', 2', 3, stand sides 1, 2 of the roll stand 10 according to the invention are connected by means of integrally formed transverse struts 11 made of uniform material. The transverse struts 11 are produced together with the stand size 1, 2 by the (indirect) additive manufacturing and/or by the casting procedure.

The rolls 7, 8 are understood in the present case as a unit rotatably accommodated in the roll stand 10, which is formed from a roll shaft and a roll body (not shown) attached thereon. A tool surface for executing the rolling procedure is formed by the roll body as a tool. The roll body is formed as a replaceable component. The connection to the roll shaft is produced in the present case by shrinking of the roll body onto the roll shaft. If the roll body is detached from the roll shaft, the roll shaft can be removed laterally from the roll stand 10. It is thus not necessary to separate the stand sides 1, 2.

It is obvious that the above-described roll stand can also be produced by direct additive manufacturing. The properties of the additively joined stand material are to be taken into consideration accordingly in the computed shaping.

LIST OF REFERENCE SIGNS

1' first stand side of prior art
1 first stand side according to the invention
2' second stand side of prior art
2 second stand side according to the invention
3 connecting bolt
4 retaining element
5 bearing for drive unit
6 crank pin
6a receptacle for crank pin
7 first roll
8 second roll
9 gear wheel for roll drive
10 additively manufactured roll stand
11 integral transverse struts made of uniform material

The invention claimed is:
1. A roll stand, comprising:
at least two rolls for forming a workpiece are accommodated in the stand,
wherein a rolling force acting during the forming is supported by the roll stand,
wherein the roll stand is produced by means of additive manufacturing,
wherein the additive manufacturing is performed indirectly, wherein the roll stand is formed at least partially as a cast part and a casting mold of the roll stand is produced directly by additive manufacturing, or
wherein the roll stand is formed, at least partially, directly by additive manufacturing, wherein the stand sides are integrally interconnected by transverse struts made of a uniform material, a first transverse strut extending between the stand sides relative to a longitudinal axis of the stand sides and a second transverse strut extending between the stand sides perpendicular relative to the first transverse strut, wherein the transverse struts are produced jointly with the stand sides by additive manufacturing.

2. The roll stand as claimed in claim 1, wherein the roll stand is formed as a unit which is drivably movable in the course of a rolling procedure.

3. The roll stand as claimed in claim 2, wherein the roll stand is formed as a cold pilger roll stand.

4. The roll stand as claimed in claim 3, wherein at least one crank pin for moving the roll stand is accommodated on the roll stand, wherein in particular the crank pin is not formed by means of additive manufacturing.

5. The roll stand as claimed in claim 1, wherein the roll stand includes two stand sides, wherein the rolls extend between the stand sides and are mounted in the stand sides.

6. The roll stand as claimed in claim 1, wherein a shape of the roll stand is optimized with regard to mass and/or strength by a computer optimization using the finite element method.

7. A method for improving an existing rolling mill, comprising:
 a. recording framework parameters of the existing roll stand of claim 1;
 b. designing a roll stand optimized with respect to at least one property while maintaining the framework parameters recorded in step a.;
 c. manufacturing a new roll stand by additive manufacturing, and
 d. replacing the existing roll stand with the new roll stand.

* * * * *